United States Patent [19]
Call et al.

[11] Patent Number: 5,533,256
[45] Date of Patent: Jul. 9, 1996

[54] METHOD FOR DIRECTLY JOINING A CHIP TO A HEAT SINK

[75] Inventors: Anson J. Call, Holmes; Stephen H. Meisner, Hudson; Frank L. Pompeo, Walden; Jeffrey A. Zitz, Poughkeepsie, all of N.Y.

[73] Assignee: International Business Machines Corporation, Armonk, N.Y.

[21] Appl. No.: 461,814

[22] Filed: Jun. 5, 1995

Related U.S. Application Data

[62] Division of Ser. No. 279,734, Jul. 22, 1994, abandoned.

[51] Int. Cl.⁶ .................................................. H05K 3/34
[52] U.S. Cl. ........................... 29/840; 174/16.3; 437/209
[58] Field of Search ............... 29/840, 825; 437/209; 174/16 AS

[56] References Cited

U.S. PATENT DOCUMENTS

| | | | |
|---|---|---|---|
| 4,092,697 | 5/1978 | Spaight . | |
| 4,233,645 | 11/1980 | Balderes et al. . | |
| 4,254,431 | 3/1981 | Babuka et al. | 357/82 |
| 4,489,487 | 12/1984 | Bura | 29/840 |
| 4,506,443 | 3/1985 | Itoh | 29/840 |
| 4,654,966 | 4/1987 | Kohara et al. | 29/840 |
| 4,703,339 | 10/1987 | Matsuo . | |
| 4,849,856 | 7/1989 | Funari et al. . | |
| 4,926,242 | 5/1990 | Itoh et al. | 357/81 |
| 4,939,570 | 7/1990 | Bickford et al. . | |
| 4,999,699 | 3/1991 | Christie et al. | 357/65 |
| 5,107,330 | 4/1992 | Dahringer . | |
| 5,173,839 | 12/1992 | Metz, Jr. . | |
| 5,199,164 | 4/1993 | Kim et al. | 29/840 |
| 5,249,101 | 9/1993 | Frey et al. | 361/717 |
| 5,263,245 | 11/1993 | Patel et al. | 29/940 |
| 5,359,768 | 11/1994 | Haley | 29/840 |
| 5,362,680 | 11/1994 | Heinen et al. | 437/209 |

OTHER PUBLICATIONS

Research Disclosure, No. 270, Publication No. 27014, (Oct. 1986), entitled "Stick-On Heat Sink".

*Primary Examiner*—Carl J. Arbes
*Attorney, Agent, or Firm*—Aziz M. Ahsan

[57] ABSTRACT

The present invention relates generally to a new apparatus and method for directly joining a chip to a heat sink. More particularly, the invention encompasses an apparatus and a method that uses a double-sided, pressure-sensitive, thermally-conductive adhesive tape to directly join a chip or similar such device to a heat sink.

14 Claims, 2 Drawing Sheets

METHOD FOR DIRECTLY JOINING A CHIP TO A HEAT SINK

CROSS-REFERENCE TO RELATED PATENT APPLICATIONS

This patent application is a Divisional patent application of U.S. patent application Ser. No. 08/279,734, which was filed on Jul. 22, 1994, now abandoned.

This patent application is related to U.S. patent application Ser. No. 08/279,606, filed Jul. 22, 1994, entitled "CHIP CARRIER WITH SINGLE PROTECTIVE ENCAPSULANT", assigned to the assignee of the instant Patent Application, and the disclosure of which is incorporated herein by reference.

FIELD OF THE INVENTION

The present invention relates generally to a new apparatus and method for directly joining a chip to a heat sink. More particularly, the invention encompasses an apparatus and a method that uses a double-sided, pressure-sensitive, thermally-conductive adhesive tape to directly join a chip or similar such device to a heat sink.

BACKGROUND OF THE INVENTION

Semiconductor devices are becoming smaller and more dense with the evolution of new technology. However, increases in circuit density produce a corresponding increase in overall chip packaging strategies in order to remain competitive. Chip and chip carrier manufacturers are therefore constantly being challenged to improve the quality of their products by identifying and eliminating problems, reducing package size and weight, decreasing package costs, providing improved thermal efficiencies and better and more advanced chips. Whereas significant improvements are being made to eliminate systematic problems by reducing process variability. Process improvements alone are not sufficient to eliminate all the problems which effect both performance and reliability.

One way to increase performance and reliability is to provide the shortest and most efficient thermal cooling path for the integrated circuit chips. This could be done by bringing the chip physically as close as possible to the heat sink. Another way would be to provide more efficient cooling of the chip. However, when the chips are brought closer to the heat sink, means also have to be provided to securely provide a thermal contact between the chip and the heat sink. In some cases thermally conductive epoxies have been used to provide a better thermal contact between the chip and the heat sink, and in others some sort of thermal type paste has been used.

Research Disclosure, No. 270, Publication No. 27014 (October 1986), the disclosure of which is incorporated herein by reference, discloses a stick-on heat sink. A heat sink is attached to a module by sliding the module into the heat sink and where the edges of the heat sink snap close to secure the heat sink to the module. It is also disclosed that an adhesive or double sided tape could also be placed on the bottom surface of the heat sink to assure intimate contact between the module and the heat sink.

U.S. Pat. No. 4,092,697 (Spaight), the disclosure of which is incorporated herein by reference, discloses placing a film of thermally conductive material between the chip and the heat sink or heat radiator.

U.S. Pat. No 4,233,645 (Balderes et al.), discloses placing a block of porous material which is impregnated with a suitable liquid between the chip and the heat sink to provide a thermally conductive path.

U.S. Pat. No. 4,849,856 (Funari et al.), the disclosure of which is incorporated herein by reference, discloses a direct chip to heat sink attachment process where a thermally conductive adhesive is used to directly secure the heat sink to the chip.

U.S. Pat. No. 4,939,570 (Bickford et al.), the disclosure of which is incorporated herein by reference, discloses another direct chip to heat sink attachment process where a thermally conductive adhesive is used to directly secure the heat sink to the chip.

U.S. Pat. No. 4,999,699 (Christie, et al.), the disclosure of which is incorporated herein by reference, discloses solder interconnection whereby the gap created by solder connections between a carrier substrate and semiconductor device is filled with a composition obtained from curing a preparation containing a cycloaliphatic polyepoxide and/or curable cyanate ester or prepolymer thereof; filler having a maximum particle size of 31 microns and being at least substantially free of alpha particle emissions.

U.S. Pat. No. 5,249,101 (Frey, et al.), the disclosure of which is incorporated herein by reference, discloses a coverless chip carrier which uses at least two encapsulants. The first encapsulant is used to provide flip-chip fatigue life enhancement. The second encapsulant is used to provide limited environmental protection. A third encapsulant is also required for carriers using peripheral leads to contain the second encapsulant prior to curing. Also disclosed is that the encapsulant have a CTE (Coefficient of Thermal Expansion) which is within 30 percent of the CTE of the solder balls.

The inventors of this invention, however, are using an entirely different approach to solve this age old problem. They are using a double-sided, pressure-sensitive, thermally-conductive, adhesive tape to directly attach the chip to the heat sink and provide a secure thermal contact between the two.

Furthermore, they have disclosed a novel method and structure which ensures the integrity of the bond between the heat sink and the substrate or chip carrier.

The structure and process of this invention offers several advantages over the prior art. For example, it provide a simplified modular construction, therefore, it utilizes fewer materials and process steps for assembly, and allows ease of workability or repair of the assembled module.

PURPOSES AND SUMMARY OF THE INVENTION

The invention is a novel method and an apparatus for using a double-sided, thermally-conductive, pressure-sensitive adhesive tape to attach a chip to a heat sink. The invention also encompasses a novel apparatus and method for direct attachment of a heat sink to a chip and/or a substrate.

Therefore, one purpose of this invention is to provide an apparatus and a method that will provide a direct thermal path using a double-sided, thermally-conductive, pressure-sensitive adhesive tape between a chip a heat sink.

Another purpose of this invention is to provide a double-sided, thermally-conductive, pressure-sensitive, adhesive tape between a chip and a heat sink to ensure a secure thermal contact between the two.

Still another purpose of this invention is to have a very economical and efficient thermally conductive path between a chip and a heat sink.

Yet another purpose of this invention is to increase the available area on the substrate or the chip carrier for device joining, for example, active devices, such as, chips, or passive devices, such as, capacitors, etc.

Still yet another purpose of the invention is to provide a method and apparatus for ensuring the integrity of the bond between the chip and the heat sink.

Yet another purpose of this invention is the ability to rework or repair the completed or assembled module.

Therefore, in one aspect this invention comprises an apparatus to provide a direct thermally conductive path between at least one chip and at least one heat sink, wherein said apparatus comprises of a double-sided thermally-conductive adhesive tape that secures said heat sink to said at least one chip.

In another aspect this invention comprises a method to provide a direct thermally conductive path between at least one chip and at least one heat sink, wherein said method comprises securing at least a first portion of a double-sided thermally-conductive adhesive tape on one surface of said chip and a second portion on at least a portion of said heat sink.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

IBM's multilayered ceramic (MLC) electronic packages are among the most technically advanced electronic packages in the industry: however, they are also very expensive. This invention describes one way to reduce cost of such packages without any loss or degradation of their performance. Packaging methods which reduces cost advantageously increases the availability of such electronic packages in the marketplace. As a person skilled in the art knows that increased packaging density is typically achieved by greater utilization of the real estate of the substrate or module.

Figure 1:
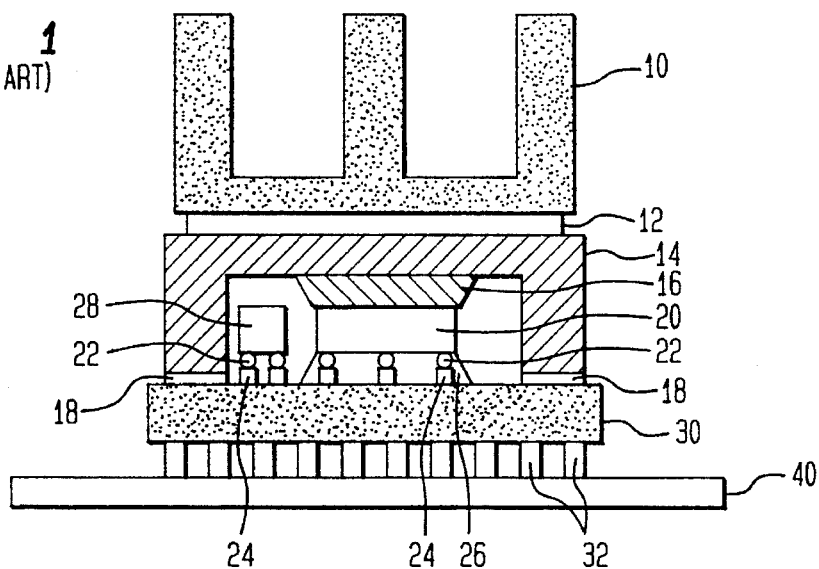
FIG. 1, illustrates one prior art scheme to connect a chip to a heat sink.

FIG. 1, illustrates one prior art scheme to connect a chip 20, to a heat sink 10. Typically, the chip 20, is first secured to a substrate or module 30, via a plurality of solder balls 22, on pads 24, that are on the substrate or module 30. The substrate 30, could also have one or more electronic device(s) 28, such as, for example, a decoupling capacitor 28, that is also electrically connected to the substrate 30, via the pads 24, and solder balls 22. For some applications the solder balls 22, and pads 24, could be encapsulated with an encapsulant 26. A thermally conductive compound or material 16, is usually applied over the exposed surface of the chip 20, such that a direct thermal contact is made between the chip 20, and the cap or cover 14, when the cover 14, is placed over to cover the chip 20. A cap sealant 18, is typically provided, in order to secure the cap or cover 14, to the substrate or module 30. The heat sink 10, can now be secured to the cap or cover 14, using a heat sink adhesive 12. The substrate 30, is typically secured to a mother board or card 40, via I/O (Input/Output) means 32, such as, for example, pads, pins, etc.

The cap or cover 14, is typically a metallic or ceramic cap, that is placed over the chip 20, and is permanently secured to the surface of the substrate 30. This is done primarily to prevent; mechanical and chemical injury to the chip 20, solder balls 22, decoupling capacitors 28, encapsulant 26, and any exposed metallurgy or circuitry on the substrate or module 30. It is well known that a leak in the cap 14, or in the cap sealant 18, or any misalignment of the cap 14, may result in irrecoverable module yield losses. These losses could be substantial for an expensive module. A picture-frame type area on the top surface of the substrate 30, is required to specifically seal the cap 14, to the substrate 30, using the cap sealant 18. This frame type surface could be between about 2 mm and about 6 mm wide. Therefore, the placement of all devices, such as, for example, chips 20, decoupling capacitors 28, is restricted to be within this picture frame area, which is typically only between about 50% and about 70%, of the area that would otherwise be available for additional or larger devices. Additionally, the cap or cover 14, typically adds between about 30% and about 50%, to the overall height of the module. Thermal compound 16, must be placed between the chip 20, and the cap 14, to provide an efficient heat transfer path via the heat sink adhesive 12, to the heat sink 10. Furthermore, the presence of the cap or cover 14, adds additional weight to the completed or assembled module.

Figure 2:
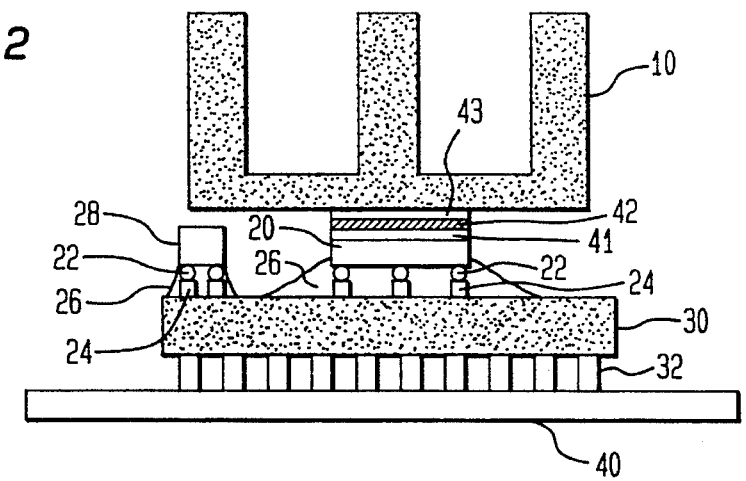
FIG. 2, illustrates a preferred embodiment of this invention.

FIG. 2, illustrates a preferred embodiment of this invention. It has been discovered that for some applications it is prudent to directly join the heat sink 10, to the upper or exposed surface of the chip 20. Various methods have been tried in the past but it has now-been found that a double-sided, pressure-sensitive, thermally-conductive adhesive tape 42, having adhesive 41 and 43, provides the best thermal path from the chip 20, to the heat sink 10. This tape 42, also provides reworkability, as the heat sink 10, can be easily removed for rework or repair of any of the components on the module.

Normally, after one surface of the chip 20, has been properly secured to the substrate 30, the adhesive side 41, of the double-sided, thermally-conductive adhesive tape 42, is secured to the back-side or the non-solder ball side of the chip 20. This could be done manually or by using a suitable machine. The heat sink 10, is then made to contact the adhesive 43, of the double-sided, thermally conductive tape 42, and is secured thereto. For most applications the heat sink 10, will hang over the edges of the chip 20, i.e., the outer edge portions of the heat sink 10, extend beyond the outer edge portions of the chip 20. Care should be taken that the heat sink 10, does not interfere with other electronic components that may be on or near the substrate 30.

As can be clearly seen in FIG. 2, that with the elimination of the cap 14, thermally conductive material 16, cap sealant 18, and heat sink adhesive 12, a tremendous amount of gain has been made in the MLC packaging art. The same chip 20, is now more closer to the heat sink or heat radiator 10, and so now the chip 20, will cool faster and more efficiently. Additionally, more real estate is now available on the surface of the substrate 30, for the placement of more or bigger electronic components.

The simplified electronic package of this invention will replace the existing cap/seal/thermal compound encapsulation system. The preferred encapsulant 26, that is used to encapsulate at least a portion of the solder columns or balls 22, and pads 24, is an EPX5341 encapsulant. EPX5341, is a Trademark of IBM Corporation, Armonk, N.Y., U.S.A. The EPX5341 encapsulant primarily serves two purposes. The first is that it improves the solder ball or solder column's fatigue reliability and secondly it provides an effective barrier against environmental and process exposures.

Figure 3:
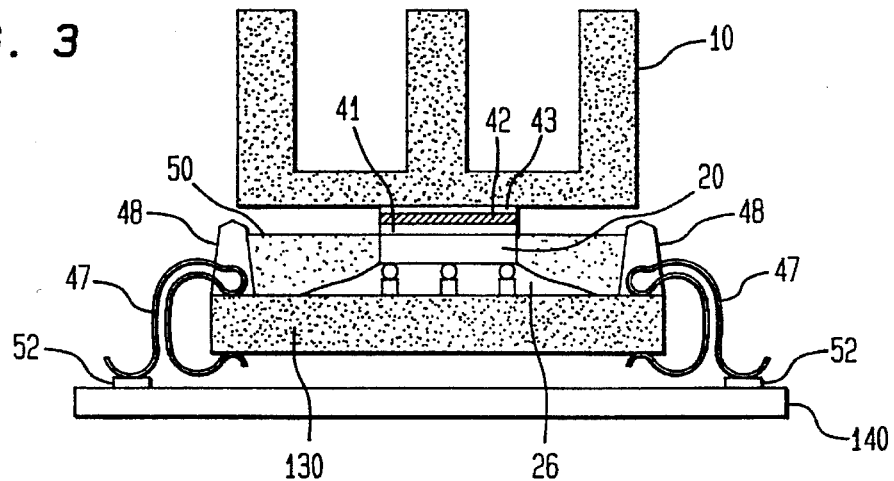
FIG. 3, illustrates another preferred embodiment of this invention.

FIG. 3, illustrates another preferred embodiment of this invention, where the chip 20, is on a substrate 130, that is connected to a card or mother board 140. Before the chip 20, is secured to the heat sink 10, via the double-sided, pressure-sensitive, thermally-conductive, adhesive tape 42, it has been found that for some applications it is better to encapsulate a portion of the chip 20, the substrate 130, the first encapsulant 26, with a second encapsulant 50. In order to ensure that the second encapsulant 50, does not run over the edges of the substrate 130, one could have dams 48, such as a polymer dam 48.

Environmental protection can be furnished by a second encapsulant 50, and as a UV cured urethane overcoat 50, called C5, which covers the first encapsulant 26, such as the EPX5341, and exposed substrate metallurgy. C5 is a Trademark of IBM Corporation, Armonk, N.Y., U.S.A. Typically C5 is dispensed in liquid form and requires a 3rd level of polymer, called Hysol, to be dispensed and cured prior to the dispensing of C5. Hysol is a Trademark of Dexter Electronic Materials Inc., Industry, Calif., U.S.A. Hysol can be used as a dam 48, to prevent the liquid C5, from flowing over the side of the substrate 30, prior to curing of the C5 material 50. The C5 has the additional function of protecting the fragile clip lead bonds 47. It should be noted that both EPX5341 and Hysol require heat curing.

As shown in FIG. 3, the electrical connection from the substrate 130, to the card or mother board 140, is provided via I/O means 47, such as, for example, electrically conducive clips 47, that are electrically connected to the pads 52, that are on the card 140.

Figure 4:
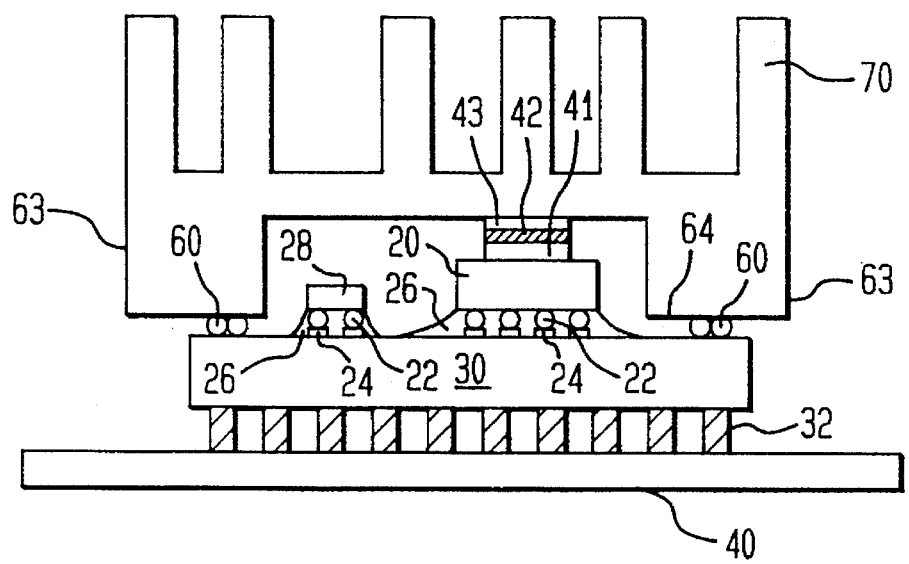
FIG. 4, illustrates yet another preferred embodiment of this invention.

FIG. 4, illustrates yet another preferred embodiment of this invention, where the heat sink 70, has an extension 63. The extension 63, has a base 64, which is substantially flat. The extension 63, should be such that the heat sink 70, completely envelopes the electronic components that are on the surface of the substrate 30, such as the chip 20, or the decoupling capacitor 28. Furthermore, the extension 63, should have sufficient space to accommodate the double-sided, thermally-conductive adhesive tape 42, i.e., that at least a portion of the adhesive 43, makes contact with a portion of the heat sink 70, while at least a portion of the adhesive 41, makes contact with at least a portion of the upper surface of the chip 20. At least one adhesive 60, such as a acrylic dot or paste 60, or an epoxy or a suitable polymer 60, is either applied to the peripheral surface of the substrate 30, or to the base 64, and then using this adhesive acrylic dot or paste 60, the heat sink 70, is secured preferably to the peripheral edge surface of the substrate 30. One suitable acrylic 60, that could be used is LOCTITE OUTPUT 384, which is a Trademark of Loctite Corp., Newington, Conn., U.S.A. If sufficient amount of the adhesive 60, is applied to secure the heat sink 70, to the substrate 30, then this could also provide some environmental protection to the electronic components and other features that are on the surface of the substrate 30, and enveloped by the heat sink 70.

Figure 5:
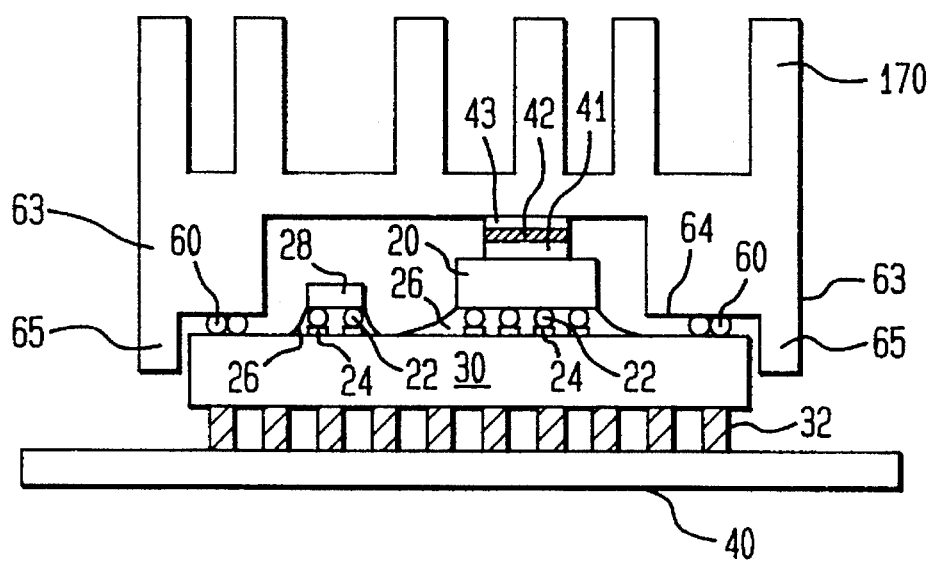
FIG. 5, illustrates still yet another preferred embodiment of this invention.

FIG. 5, illustrates still yet another preferred embodiment of this invention. Heat sink 170, has a lip or tab 65, that extends at the peripheral edges of the extension 63, and also extends along at least a portion of the peripheral edges of the substrate 30. The lip 65, protects the heat sink 170, from being knocked-off the substrate 30.

The bond integrity between the heat sink 170, and the chip 20, made by the pressure-sensitive adhesive tape 42, is ensured by the adhesive bond 60. For some applications one would not need the adhesive bond 60, due to the presence of the lip or tab 65. Furthermore, the tab 65, that closely fits the peripheral edges of the substrate 30, prevents rocking or torquing or other movement of the heat sink 70, under load.

The advantages of an electronic package or module such as the one disclosed in this patent application are many. Such as, the cost of the package is reduced due to (a) fewer process steps to assemble the module, (b) the elimination of the cap, cap seal, thermal compound and related steps, (c) the elimination of yield loss associated with cap misalignment and cap seal leak, etc.

Furthermore, this inventive structure provides a more efficient use of the substrate top surface area, because now nearly 100 percent of the substrate top surface area is available for electronic components and other features. Additionally, the overall module height is reduced between about 30 percent to about 50 percent, because of the deletion of the cap, which allows more room for a cooling device or allows the system designer to reduce the card pitch. This packaging scheme also allows for direct heat sink attach to the chip, thus eliminating the thermal compound and further improving the thermal performance of the module.

Another advantage of using a double-sided, thermally-conductive adhesive tape is the reworkability or repair of the module. The heat sink can be easily pulled-off from the substrate or the chip and the active devices, such as, a chip, or passive devices, such as, a decoupling capacitor, heat sink, etc., or module in its entirety could be reworked or repaired. Furthermore, any circuits on the surface of the substrate could also be reworked or repaired after the heat sink has been removed. Of course a heat sink can be reattached once the rework or repairs have been made.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method to provide a direct thermally conductive path between at least one chip and at least one heat sink, wherein said method comprises the steps of:

(a) interposing a double-sided thermally-conductive adhesive tape having a first surface and a second surface between said at least one chip and said at least one heat sink, wherein said first surface and said second surface are opposite each other, (b) securing at least a portion of said at least first surface of said double-sided thermally-conductive adhesive tape to one surface of said chip, and (c) securing at least a portion of said second surface to at least a portion of said heat sink, and thereby providing said direct thermally conductive path between at least one chip and at least one heat sink.

2. The method of claim 1, wherein said double-sided adhesive tape is pressure-sensitive.

3. The method of claim 1, wherein at least a portion of said chip is secured to a substrate using at least one first electrical connection.

4. The method of claim 3, wherein at least a portion of said at least one first electrical connection is encapsulated with at least one encapsulant material.

5. The method of claim 3, wherein said at least one first electrical connection is selected from a group consisting of solder ball, solder column, low-melting point solder or high-melting point solder.

6. The method of claim 3, wherein said substrate has at least one additional electronic device secured thereto.

7. The method of claim 6, wherein said at least one additional electronic device is a decoupling capacitor.

8. The method of claim 1, wherein at least a portion of said chip is secured to a substrate using at least one first electrical connection and wherein said substrate is itself secured to a card using at least one second electrical connection.

9. The method of claim 8, wherein said second electrical connection is selected from a group consisting of solder ball, solder column, low-melting point solder, high-melting point solder, pad or clip.

10. The method of claim 1, wherein at least a portion of said chip is secured to a substrate and wherein said substrate has a dam to hold at least one encapsulant material.

11. The method of claim 3, wherein at least a portion said heat sink has an extension and wherein at least a portion of said extension is secured to said substrate.

12. The method of claim 3, wherein at least a portion of said heat sink has an extension and wherein said extension has a lip that extends beyond the peripheral edges of said substrate.

13. The method of claim 11, wherein said extension has a base and wherein at least a portion of said base is secured to at least a portion of the peripheral edges of said substrate with an adhesive.

14. The method of claim 13, wherein the material for said adhesive is selected from a group consisting of acrylic, epoxy or polymeric material.

* * * * *